(12) United States Patent
Asakawa

(10) Patent No.: US 8,251,530 B2
(45) Date of Patent: Aug. 28, 2012

(54) LIGHT EMITTING DEVICE

(75) Inventor: Hideo Asakawa, Anan (JP)

(73) Assignee: Nichia Corporation, Anan-shi (JP)

( * ) Notice: Subject to any disclaimer, the term of this patent is extended or adjusted under 35 U.S.C. 154(b) by 305 days.

(21) Appl. No.: 12/593,205

(22) PCT Filed: Mar. 21, 2008

(86) PCT No.: PCT/JP2008/055216
§ 371 (c)(1),
(2), (4) Date: Nov. 10, 2009

(87) PCT Pub. No.: WO2008/117737
PCT Pub. Date: Oct. 2, 2008

(65) Prior Publication Data
US 2010/0109042 A1 May 6, 2010

(30) Foreign Application Priority Data
Mar. 26, 2007 (JP) .............................. P 2007-078521

(51) Int. Cl.
*G02F 1/13357* (2006.01)
*G09F 13/04* (2006.01)
(52) U.S. Cl. .............. 362/97.1; 362/249.02; 362/311.02
(58) Field of Classification Search .................. 362/612, 362/555, 97.1, 97.3, 249.02, 311.02
See application file for complete search history.

(56) References Cited

U.S. PATENT DOCUMENTS

| 6,603,404 | B1 | 8/2003 | Tsuji | |
| 7,815,339 | B2 * | 10/2010 | Veenstra et al. | 362/249.02 |
| 2004/0240229 | A1 * | 12/2004 | Blumel et al. | 362/555 |
| 2006/0022216 | A1 | 2/2006 | Chikugawa | |
| 2007/0147087 | A1 * | 6/2007 | Parker et al. | 362/615 |

FOREIGN PATENT DOCUMENTS

| EP | 1538680 A2 | 6/2005 |
| JP | 59-67659 A | 4/1984 |
| JP | 2002-49334 A | 2/2002 |
| JP | 2002-280616 A | 9/2002 |
| JP | 2003-168824 A | 6/2003 |
| JP | 2003168824 A * | 6/2003 |
| JP | 2004-207688 A | 7/2004 |
| JP | 2006-49442 A | 2/2006 |
| JP | 2006-253551 A | 9/2006 |

OTHER PUBLICATIONS

Extended European Search Report dated Jul. 4, 2011 for Application No. 08722580.1.

* cited by examiner

*Primary Examiner* — David V Bruce
(74) *Attorney, Agent, or Firm* — Birch, Stewart, Kolasch & Birch, LLP

(57) ABSTRACT

To provide a low-profile light emitting device which can be manufactured with good productivity without worsening mold releasability and can prevent bending an end terminal of a lead electrode during handling of the light emitting device. A light emitting device comprising: a light emitting element; and a package having lead electrodes for connection to the light emitting element and an opening in front thereof for emitting light from the light emitting element in which parts of the lead electrodes project out of the package and are bent so that end portions thereof are located on side surfaces of the package, wherein side surfaces have a first face adjacent to a rear surface of the package, a second face having a plane direction different from the first face, and a third face adjacent to a front surface of the package, having a plane direction different from the second face.

22 Claims, 6 Drawing Sheets

LIGHT EMITTING DEVICE

BACKGROUND OF THE INVENTION

Field of the Invention

The present invention relates to light emitting devices using a semiconductor light emitting element, and more particularly, to thin light emitting devices used for a backlight of a liquid crystal display and the like.

Recently, a high-intensity and high-power light emitting element and a small and high-sensitive light emitting device are developed and used in various fields. Such a light emitting device is used as light sources for a mobile phone, a backlight of a liquid crystal display or various meters by utilizing small size, low power consumption and lightweight thereof.

For example, the light source of the backlight is required to be low-profile for reduction in size and weight of equipments using the light source. Therefore the light emitting device to be used as the light source is also required to be downsized. For this purpose, for example, so-called side view types of light emitting devices are variously developed.

The side-view type light emitting device is generally provided with an opening in front of a package for emitting a light therefrom, and the light emitting element mounted on a bottom of the opening. Parts of lead electrodes project from an inside to an outside of the package to function as external terminals. The structure of the light emitting device is usually formed with an injection molding by using molding dies which hold the lead electrode therebetween.

However, since walls of the package for the side-view type of light emitting device are thinner with downsizing the light emitting device, the walls of the package may not withstand a mold release resistance which is caused when the package formed with the injection molding is demolded from the molding dies, thereby breaking the package, which makes it impossible to keep its shape. If large mold release resistance impedes the demolding of products, stopping the manufacturing equipment is required to remove the products. As a result, productivity is significantly reduced.

Therefore, as shown in FIGS. 6A and 6B, side surfaces of the package have tilted surfaces (so-called "draft") in order to facilitate demolding the products from the molding dies. For example, the tilted surfaces are formed by tilting the side surfaces adjacent to a rear surface so as to spread toward the front (refer to, for example, Japanese Unexamined Patent Publication (Kokai) No. 2003-168824).

However, when the lead electrodes are bent along a bottom surface of the package, and are additionally bent so that end portions of the lead electrodes are located on the side surfaces of the package, spaces 612 are formed between the side surfaces facing the lead electrodes and end terminals are formed as shown in FIG. 6B. In such case, when the end terminals are subjected to a force toward the spaces (the force in direction where the space is narrowed) during handling of the light emitting device, problem that the end terminals buckle may happen. Bending of the end terminal may occur, for example, during a screening process or a packaging process, when fixing the light emitting device or bringing a measuring electrode into contact with the end portion for examining a light emitting.

SUMMARY OF THE INVENTION

An object of the present invention is to provide a low-profile light emitting device which can be manufactured with good productivity without worsening mold releasability and which can prevent bending the end terminals of the lead electrodes during handling of the light emitting device.

For achieving the above object, a light emitting device comprising: a light emitting element; and a package having lead electrodes to be connected to the light emitting element and an opening in front thereof for emitting a light emitted from the light emitting element in which parts of the lead electrodes project out of the package and are bent so that end portions thereof are located on side surfaces of the package, wherein side surfaces have a first face adjacent to a rear surface of the package, on which the end portions are located, a second face having a plane direction different from the first face, and a third face adjacent to a front surface of the package, having a plane direction different from the second face.

According to the light emitting device of the present invention, it is preferable that the first faces are nearly perpendicular to a principal surface of the lead electrode.

Further, according to the light emitting device of the present invention, it is preferable that the second faces are tilted so as to spread toward the front, thereby improving the mold releasability in the molding.

In addition, according to the light emitting device of the present invention, it is preferable that the third faces are tilted so as to narrow toward the front, thereby improving the mold releasability in the molding.

According to the light emitting device of the present invention, it is preferable that corners of the package along which the lead electrodes are bent are notched.

In the light emitting device of the present invention structured mentioned above, the side surfaces comprise the first face, the second face and the third face which are different in plane direction between the adjacent faces, and the first face on which the end portion of lead electrode is located is formed so as to have the plane direction different from the adjacent second and third faces. This makes it possible to form the first face in a plane direction suitable for disposing the end portion of the lead electrode and makes it possible to set the plane directions of the second and the third faces in consideration of mold releasability in the manufacturing (in the molding).

Therefore, according to the light emitting device of the present invention, the tilted surfaces can be provided at appropriate position on the side surface, thereby achieving a thin-type light emitting device without worsening productivity. In addition, according to the light emitting device of the present invention, changing a tilt angle of the first face along the lead electrode located on the side surface of the package makes it possible to realize a structure inhibited from bending of the lead terminal when being handled in various situations.

BRIEF DESCRIPTION OF REFERENCE NUMERALS

Figure 1A:
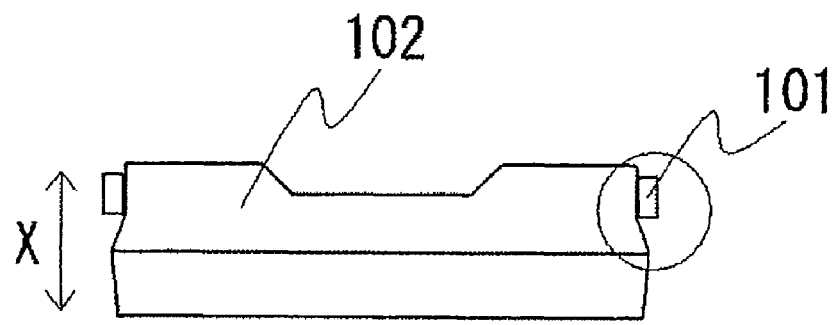
FIG. 1A is a plan view of a light emitting device according to an embodiment of the present invention.
Figure 1B:
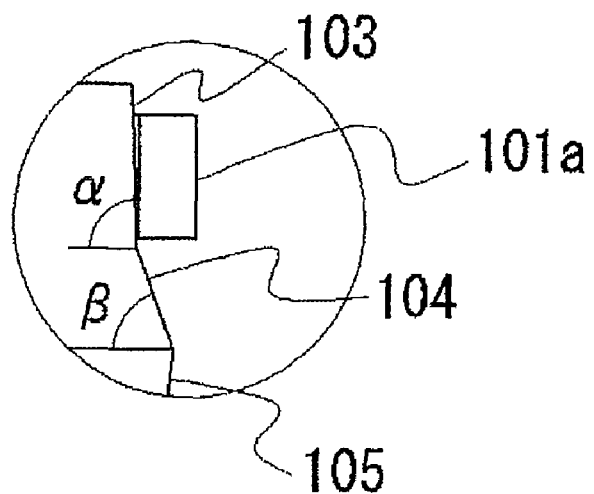
FIG. 1B is a partially enlarged view of a part of FIG. 1A.
Figure 1C:
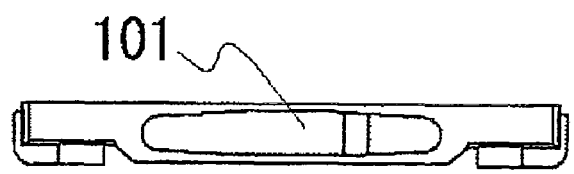
FIG. 1C is a front view of the light emitting device according to the embodiment.

400 Light emitting device
101, 401, 601 Lead electrodes
101a, 401a End portions of the lead electrodes
102, 402, 602 Package
102a Front side Package
102b Rear side package
103, 403 First face
104, 404 Second face
105, 405 Third face
106 Recess
307, 308 Molding die
309 Hanger lead electrodes
410 Draft
411 Notch
612 Space
413 Forth face

DESCRIPTION OF THE PREFERRED EMBODIMENTS

Preferred embodiments for working of the present invention will be described below. However, the embodiments described below illustrate exemplary light emitting devices for substantiating technical idea of the present invention. The light emitting device of the present invention is not limited to the embodiments described below.

It should be understood that members described in claims are not limited to members described in the embodiments. The sizes, materials, shapes, relative placements and the like described in the embodiments do not limit the scope of the present invention, and are merely examples except as specifically defined. The sizes and the positional relationship of the materials shown in each drawing are sometimes exaggerated in order to clarify explanations. In the following explanations, same names and same numerals indicate same or similar members, and then detail explanations thereof are accordingly omitted.

A light emitting device of this embodiment according to the present invention comprises a light emitting element and a package 102. The package 102 has lead electrodes 101 to be connected to the light emitting element and has a molded part. Parts of the lead electrodes 101 project out from the molded part. More specifically, projecting end portions 101a of the lead electrodes 101 are bent along side surfaces of the package 102. The package 102 has an opening in front thereof for emitting a light emitted from the light emitting element.

Especially, in the light emitting device of the present invention, both side surfaces comprise a first face 103 on which an end portion of the lead electrode is located, a second face 104 having a plane direction different from the first face 103, and a third face 105 having a plane direction different from the second face 104. The first face 103 is directed so as to be suitable for locating the end portion of the lead electrode, and the second face 104 and the third face 105 are directed with considering the mold releasability in the manufacturing (molding).

In the package of this embodiment, the first face 103 of one side surface is opposed to the first face 103 of the other side surface, the second face 104 of one side surface is opposed to the second face 104 of the other side surface, and the third face 105 of one side surface is opposed to the third face 105 of the other side surface.

In more detail, in the package of this embodiment, first faces 103 are adjacent to the rear surface of the package, and are directed so as to be suitable for locating the end portion of the lead electrode, preferably nearly perpendicular to the principal surface of the lead electrode. In the present specification, the principal surface of the lead electrode 101 indicates a surface including an exposed portion exposed from the bottom of the opening of the package. The principal surface of the lead electrodes 101 is usually parallel to the front surface of the package 102. Accordingly, the first face 103 which is nearly perpendicular to the principal surface of the lead electrode 101 is also nearly perpendicular to the front surface of the package.

The second faces 104 are located between the first face 103 and the third face 105, and have plane directions different from the first faces 103 so as to form draft in the molding. For example, when the package 102 is demolded from molding dies by moving the rear molding dies rearward, the plane directions of the second faces 104 are determined so that a distance between the second faces 104 is decreased toward the rear (i.e. increased toward the front).

The third faces 105 are adjacent to the front surface of the package, and have plane directions different from the second faces 104 so as to form draft in the molding. For example, when the package 102 is demolded from the molding dies by moving the front molding die frontward, the plane directions of the third faces 105 are determined so that a distance between the third faces 105 is decreased toward the front.

In the light emitting device of this embodiment mentioned above, the side surfaces are provided with the second faces 104 and the third faces 105 both which are tilted in view of the draft in the molding as well as the first faces 103 along which the projecting end portions 101a of the lead electrodes 101 are located. Because of this, the mold release resistance can be deduced, and the end portions 101a of the lead electrodes 101 can be bent along the package. As a result, buckle of the end terminal during handling of the light emitting device is prevented.

It is preferred that corners of the package at which the lead electrodes 101 are bent are notched. For example, when the lead electrodes 101 projects though the bottom surface of the package 102, are bent along the bottom surface, and then bent at corners between the bottom surface and the first face 103 to locate the end portions 101a along the first face 103 as illustrated in this embodiment, the corners between the bottom surface and the first face 103 is notched by round chamfering, chamfering or the like (see FIG. 5B).

When the notch such as the round chamfering or the chamfering is formed at corner along which the lead electrode 101 is bent, the lead electrodes are worked freely without shape defects of the corners of the package.

Figure 2A:
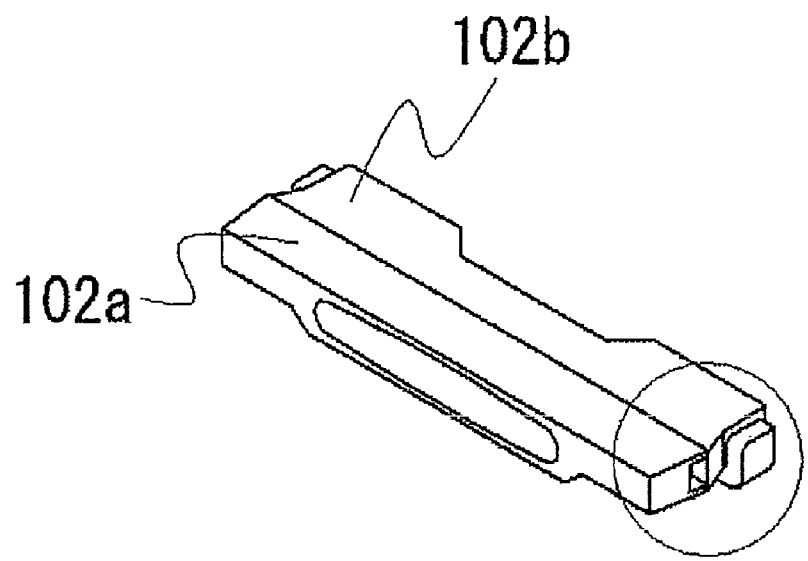
FIG. 2A is a perspective view of the light emitting device according to the embodiment.
Figure 2B:
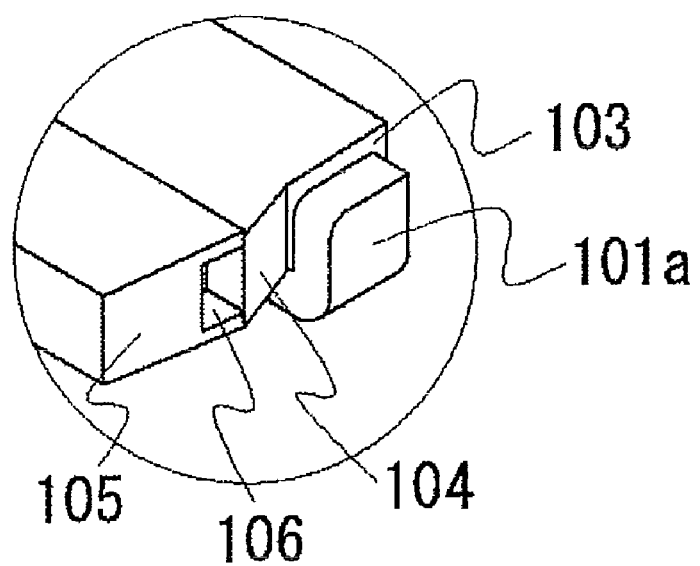
FIG. 2B is a partially enlarged view of a part of FIG. 2A.

In this embodiment, a recess 106 is formed on third face 105 as shown in FIG. 2B. This recess 106 is a portion which had been fitted with a lead electrode (hereinafter called a hanger lead electrode) for supporting the package from a cutting process of the lead electrodes 101 to a forming process thereof. The hanger lead electrode is usually made of the same metal plate of the lead electrodes 101. After finishing the cutting and forming processes, the hanger lead electrode is removed and leaves the recess 106.

A method for manufacturing the light emitting device of this embodiment will be described below with reference to FIG. 3A to FIG. 3D.

Figure 3A:
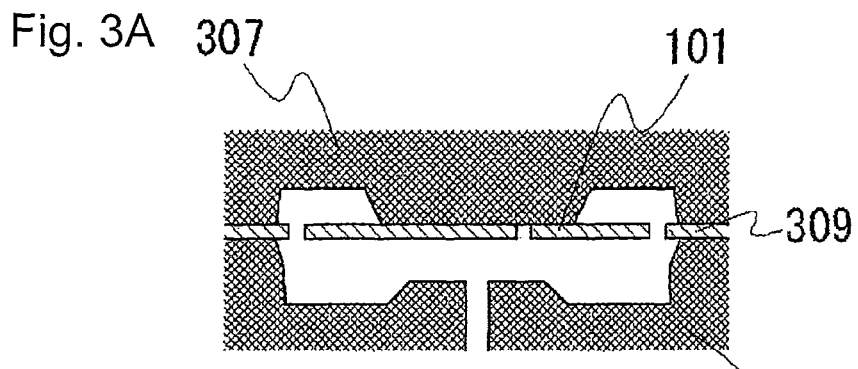
FIG. 3A is a sectional view showing a first process in a method of manufacturing the light emitting device according to the embodiment.

First, as shown in FIG. 3A, the lead electrodes 101 and the hanger lead electrode 309 are placed between the molding dies 307, 308 which are separated vertically, and then are sandwiched between the upper and lower molding dies 307, 308. In the explanations of the method for manufacturing the light emitting device, "upper" means the front surface side of the package, and "lower" means the rear surface side of the package.

Figure 3B:
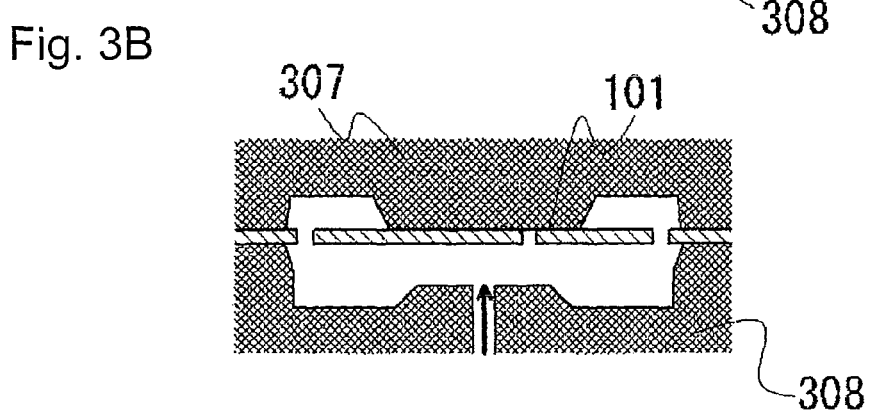
FIG. 3B is a sectional view showing a second process in the method of manufacturing the light emitting device according to the embodiment.

Then, as shown in FIG. 3B, a molding compound is injected into a cavity of the molding dies 307, 308 through a gate of the lower molding die 308.

After hardening of the molding compound in the molding dies 307, 308, the molding dies are removed upward and downward (the directions indicated by arrows in the figure). According to the light emitting device of the present invention, side surfaces are provided with the tilted surfaces (the second face and the third face), thereby decreasing the mold releasability in the molding, which makes it possible to demold the package without a defect.

Figure 3C:
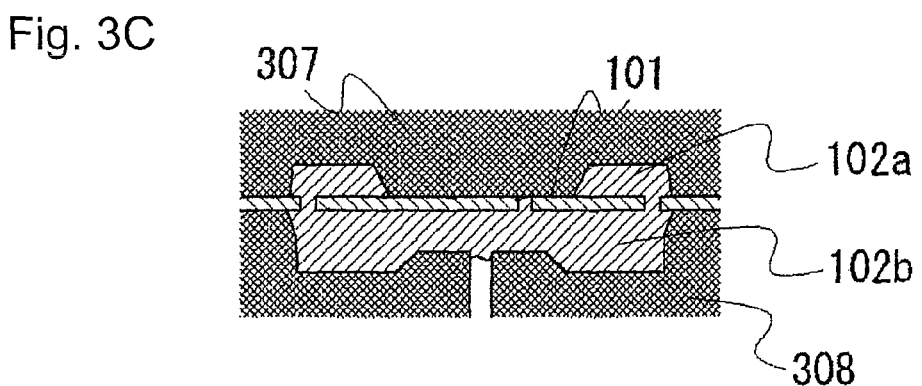
FIG. 3C is a sectional view showing a third process in the method of manufacturing the light emitting device according to the embodiment.
Figure 3D:
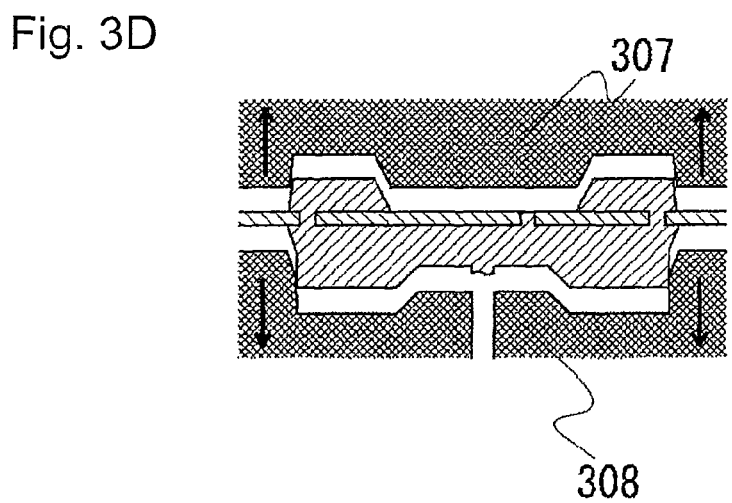
FIG. 3D is a sectional view showing a fourth process in the method of manufacturing the light emitting device according to the embodiment.

In the present specification, parts of the package which are located above and below the lead electrodes 101 are hereinafter called "front side package 102a" and "rear side package 102b" respectively as shown in FIG. 2A and FIG. 3C. That is to say, the front side package 102a indicates a part of the package which is located on the light-emitting side (the principal surface side) of the lead electrodes 101, and the rear side package 102b indicates a part of the package which is located on an opposite side of the light-emitting side.

On the surface of the front side package 102a, the opening for mounting the light emitting element is formed. While the opening may be formed on any positions of the front side package 102a depending on a mounting type of the light emitting device, it is preferable to be formed on a front surface of the front side package 102a. This will allow achieving a side view-type light emitting device with an extremely small and thin profile.

A shape of the opening is not limited, and for example, any shaped such as a cylindrical shape, an elliptic cylindrical shape, a quadrangular prismatic shape, or the like may be employed as long as the opening allows the light emitting element to be mounted in the opening, preferably on the bottom of the opening and allows a part of the surface of the lead electrodes to be exposed. With this, the light emitted from the light emitting element reflects off internal walls of the package to efficiently emit the light toward the front. The size, the depth and the like of the opening may be appropriately adjusted depending on the number of the light emitting element to be mounted, a method of bonding and the like. The internal walls of the package are preferably made of a material having a high reflectivity. When the reflectivity of the material is not high enough for total reflection, the light emitted from the light emitting element is not a little absorbed by the internal walls. In this case, when the depth of the opening is shallower, the internal walls are not illuminated with the light thereby increasing an amount of the light emitted directly, which makes it possible to improve the emission efficiency of the light. Furthermore, when the depth of the opening is shallower but the shape thereof is the same, a taper angle of the internal walls is larger, thereby improving the mold releasability from the molding dies in the molding.

It is preferable that the bottom and/or the side of the opening is subjected to processing of emboss or plasma to extend an adhesive area for improving the adhesiveness to a transparent covering material which is described below.

In the present invention, the first faces 103 and the second faces 104 are formed on side surfaces of the rear side package, and the third faces 105 are formed on side surfaces of the front side package 102a. In addition, plural faces may be formed on the front surface side of the front side package 102a.

For the purpose of the reduction of the mold release resistance, the third faces 105 of the light emitting device of the present invention are preferably tilted so as to narrow toward the front. An angle between the third face 105 and the principal surface of the lead electrode 101 is preferably in the range from 80° to 90°, more preferably in the range from 85° to 89°. In the present specification, the angle is defined on the basis of the principal surface since the lead electrodes 101 are perpendicular to moving directions of the molding dies during the molding. Generally, among the front side package and the rear side package, one with a larger depth (size in direction of X in FIG. 1A) has larger mold release resistance. Therefore, it is preferable that the one with the larger depth is provided with one tilted surface having a smaller angle between the tilted surface and the principal surface of the lead electrode than an angle between the other tilted surface and the principal surface.

In this embodiment, the lead electrodes 101 project through the bottom to the outside of the package, are bent toward the rear along the bottom, and are located on side surfaces of the rear side package. For this reason, the rear side package has the first face 103 and the second face 104. However, the present invention is not limited by this constitution. When the lead electrodes 101 is bent toward the front, two faces are located on the side surfaces of the front side package 102a in a similar way, and further an angle between the principal surface and one face on which the end portion of the lead electrode is larger than an angle between the principal surface and the other face.

Constituent members of the light emitting device of this embodiment will be described in detail below.

(Package)

In the present invention, the package 102 has the lead electrodes 101 and the molded part. The light emitting element is mounted on the package 102. The molded part acts as a supporting body for holding the lead electrodes 101 on which the light emitting element is mounted, and also has a protective function for protecting the light emitting element from the external environment.

The molding compound for the package is not limited, and for example, thermoplastic resin such as liquid crystal polymer, polyphthalamide resin or polybutylene phthalate (PBT) may be employed. In particularly, when a semi-crystalline polymer resin which includes crystal having a high melting point such as polyphthalamide resin is used as the molding compound, the package having a high surface energy and good adhesiveness with a sealing resin to be filled in the opening or with a light guide which can be attached later can be obtained. This makes it possible to suppress an interface separation between the package and the sealing resin during cooling process in a step of filling and hardening the sealing resin. White pigments such as titanium oxide may be added to the package molding compound in order to efficiently reflect the light emitted from the light emitting element.

(Light Emitting Element)

The light emitting element is usually a semiconductor light emitting element, and particularly an element such as a so-called light emitting diode may be used. Examples of such a semiconductor light emitting element include a stacked layer structure with an active layer, the stacked layer structure being formed on a substrate, by using various semiconductor materials, for example a nitride semiconductor materials such as InN, AlN, GaN, InGaN, AlGaN, or InGaAlN, III-V compound semiconductor materials, and II-VI compound semiconductor materials. An emission wavelength of an obtained light emitting element may be varied from ultraviolet region to infrared region by changing the semiconductor material, a mixed crystal ratio, a content of In in InGaN active layer, types of dopant to be doped into the active layer.

In the present invention, a single or a plurality of light emitting elements may be provided in a light emitting device. In this case, a plurality of the light emitting elements which emit the same emission color may be used for improving luminosity. Alternatively, when a plurality of the light emitting elements which emit different emission colors are used for corresponding to RGB, color reproducibility can be improved.

These light emitting elements are fixed with a jointing material on the surface of the package or on the surface of the lead electrode Epoxy resin, silicone or the like may be used as the jointing material in the case where the light emitting element which emits the blue or green light and is formed by growing the nitride semiconductor materials on a sapphire substrate is used. Alternatively, a rear side of the light emitting element may be coated with Al plating in view of deterioration caused by the light and a heat from the light emitting element, and then the light emitting element may be fixed with solders such as an Au—Sn eutectic material, brazing materials such as a low-melting-point metal, conductive pastes or the like. A light emitting element may be die bonded with conductive pastes such as silver, gold and palladium when fixing the light emitting element with electrodes on both side such as the light emitting element formed by using GaAs material and emitting the red light.

(Lead Electrodes 101)

The lead electrodes 101 are electrodes to be electrically connected to the light emitting element. The lead electrodes has a substantially plate shape including a wave shape and a plate shape with convexo-concave. The lead electrodes may have a uniform thickness or may include a thick portion or a thin portion. Materials for the lead electrodes are not limited, and preferably materials having a relatively large thermal conductivity may be used. The lead electrodes made of such the material can be effectively releases heat from light emitting element. For example, it is preferable to use the materials having properties such as the thermal conductivity of not less than about 200 W/(m·K), a relatively large mechanical strength, or an easy workability by a punching press working or an etching. Specifically, metals such as copper, aluminum, gold, silver, tungsten, iron and nickel, and alloys such as iron-nickel alloy and phosphor bronze may be preferably used. Moreover, in order to emit effectively the light emitted from the mounted light emitting element, the surfaces of lead electrode flame is preferably coated with reflective plating.

In the case where the light emitting device is a extremely low-profile and side-view type device, a width of the opening of the package will be narrow and an area for mounting the light emitting element will be shallow, therefore the high-accuracy positioning and mounting of the light emitting element is required. For this purpose, it is preferable that the lead electrodes are provided with positioning marks such as notches at parts of the lead electrodes exposed from the bottom of the opening for facilitating positioning during mounting the light emitting element.

In the light emitting device of the present invention, a protection element as well as the light emitting element may be mounted. The protection element may be mounted in the opening in which the light emitting element is also mounted, or in other opening separately formed to the package. Alternatively, the protection element may be mounted on a rear surface of the lead electrodes and then be covered with the package molding compound, which makes it possible to integrate the protection element into the molding compound. In the present invention, a single or a plurality such as two or more of protection elements may be provided. The protection element is not limited, and known element to be mounted on the light emitting device may be employed. For example, an overheat protector circuit, an overvoltage protector circuit, an overcurrent protector circuit and an electrostatic protection element may be employed. Specifically, a zener diode, a transistor diode and the like may be employed.

In the light emitting device of the present invention, it is preferable that the transparent covering material is filled in the opening in which the light emitting element is mounted. The transparent covering material protects both the light emitting elements and wires from an external force, moisture and the like Transparent resins that have high weatherability such as epoxy resin, silicone resin, acrylic resin, urea resin, fluorocarbon resin and a hybrid resin, and glass may be used for the transparent covering material. Especially, in the case where the transparent resins are used as the transparent covering material, moisture contained in the transparent resins can be release to outside by baking at 100° C. for 14 hours even if the transparent covering material made of the transparent resins contains moisture during manufacturing or storage. Therefore the transparent resins makes it possible to prevent a hydrovolcanic explosion and a separation between the light emitting element and the transparent covering material.

The transparent covering materials may include diffusing agents or fluorescent materials. The diffusing agents are used for diffusing light, which makes it possible to relax a directionality of the light emitted from the light emitting element and increase a view angle of the light emitting device. The fluorescent materials are used for converting the light emitted from the light emitting element, and then convert the wavelength of the light which is emitted from the light emitting element and emitting out of the package. When the light emitting element emits a short wavelength visible light having a high energy, organic fluorescent materials such as a perylene derivative or inorganic fluorescent materials such as ZnCdS:Cu, YAG:Ce and nitrogen-containing CaO—$Al_2O_3$—$SiO_2$ activated by Eu and/or Cr are preferably employed. In the present invention, YAG:Ce fluorescent material is preferably employed for obtaining a white light since both a blue light emitted from a blue light emitting element and a yellowish light as a complementary color of the blue light which is emitted from the fluorescent material when it absorbs a part of the blue light, can be emitted by depending on a content of the YAG:Ce fluorescent materials, thereby producing a high-reliability white-type light emitting device relatively easily. In a similar way, the fluorescent material of the nitrogen-containing CaO—$Al_2O_3$—$SiO_2$ activated by Eu and/or Cr is preferably employed for obtaining a white light since both a blue light emitted from a blue light emitting element and a reddish light as a complementary color of the blue light which is emitted from the fluorescent material when it absorbs a part of the blue light, can be emitted by depending on a content of the fluorescent materials of the nitrogen-containing $CaO-Al_2O_3-SiO_2$ activated by Eu and/or Cr, thereby producing a high-reliability white-type light emitting device relatively easily. In addition, when the fluorescent materials are fully settled to remove bubbles, an irregular color of the light emitting device can be suppressed.

Examples of the present invention will be described in detail below with reference to the drawings. It should be understood that the present invention is not limited only to the examples described below.

EXAMPLES

Figure 4A:
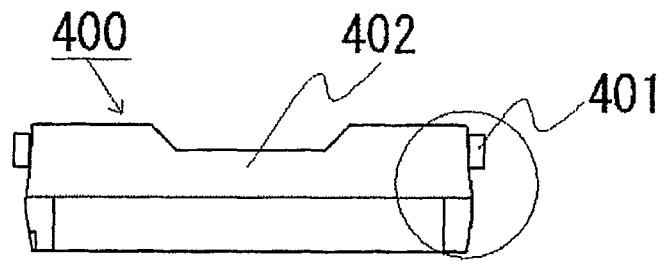
FIG. 4A is a plan view of a light emitting device according to an example of the present invention.
Figure 4B:
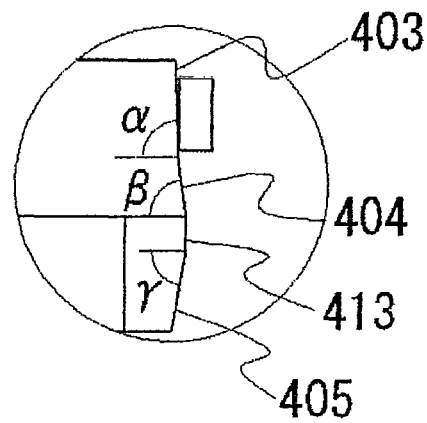
FIG. 4B is a partially enlarged view of a part of FIG. 4A.
Figure 4C:
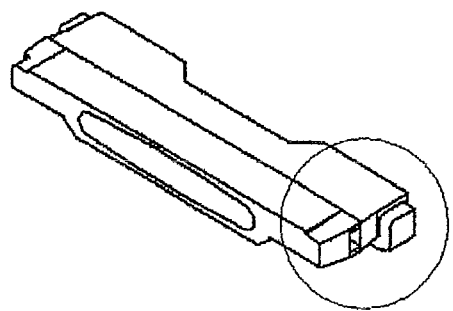
FIG. 4C is a perspective view of the light emitting device according to the example.
Figure 4D:
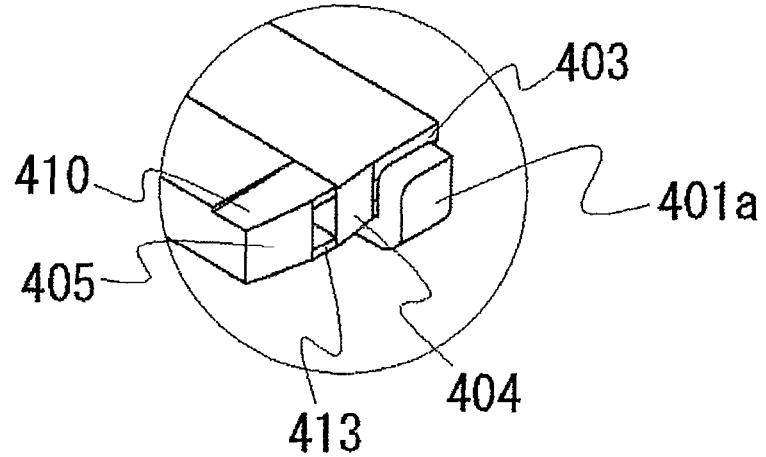
FIG. 4D is a partially enlarged view of a part of FIG. 4C.

A light emitting device 400 of this example is an extremely low-profile side-view-type light emitting device of about 0.4 mm in thickness. FIG. 4A is a plan view of the light emitting device of this example, FIG. 4B is a partially enlarged view of a part of FIG. 4A, FIG. 4C is a perspective view of the light emitting device, and FIG. 4D is a partially enlarged view of a part of FIG. 4C.

The light emitting device 400 of this example comprises one light emitting element (not shown), lead electrodes 401 to be electrically connected to the light emitting element, and a package 402 for integrally holding the lead electrodes 401

The lead electrodes is formed from an plate of a copper alloy containing iron and has portions which project through the bottom of the package to the outside of the package and act as end terminals of the lead electrodes. Surfaces of the lead electrodes 401 are coat with silver plating in order to effectively emit the light emitted from the mounted light emitting element.

In the light emitting device of this example, side surfaces of a rear side package have a first face 403 adjacent to a rear surface of the package and a second face 404 adjacent to the first face 403, and side surfaces of a front side package have a third face 405 adjacent to the front surface of the package and a forth face 413 located between the second face 404 and the third face 404.

According to this example, an angle (α in FIG. 4B) between the first face 403 and a principal surface of the lead electrode 401 is about 87°, and an angle (β in FIG. 4B) between the second face 404 and the principal surface of the lead electrode 401 is about 82°. The third face 405 as the side surface of the front side package is tapered, and an angle (y in FIG. 4B) between the third face 405 and the principal surface of the lead electrode 401 is about 80°. These tilted faces allow a low-profile light emitting device to be manufactured with good productivity, and also to prevent bending the end terminals of the lead electrodes during various handling of the light emitting device since the end portions of the end terminals of the lead electrodes can be bent along the package.

An angle between the fourth face 413 and the principal surface of the lead electrode is about 90°. Because of this, a recess formed on the fourth face 413 can be bigger (deeper) and therefore can securely hold the hanger lead electrode.

Figure 5A:
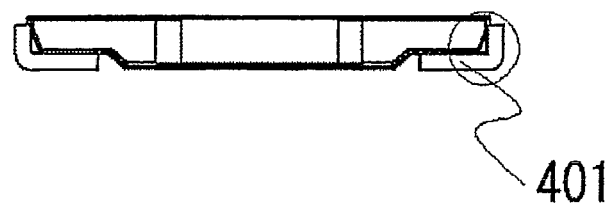
FIG. 5A is a rear view of a light emitting device according to an example of the present invention.
Figure 5B:
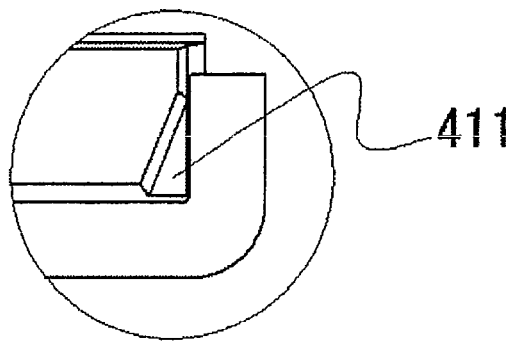
FIG. 5B is a partially enlarged view of a part of FIG. 5A.
Figure 5C:
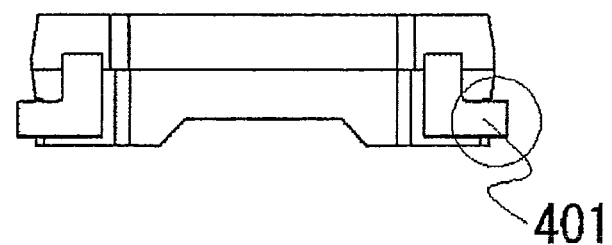
FIG. 5C is a bottom view of a light emitting device according to an example of the present invention.
Figure 5D:
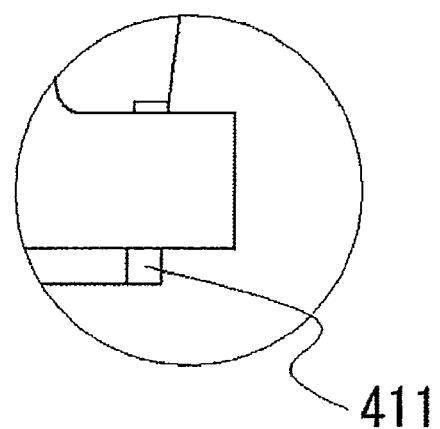
FIG. 5D is a partially enlarged view of a part of FIG. 5C.
Figure 6A:
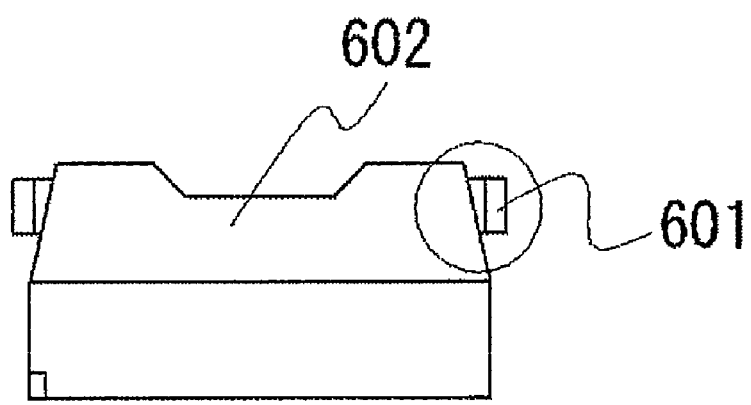
FIG. 6A is a plan view of a previous light emitting device.
Figure 6B:
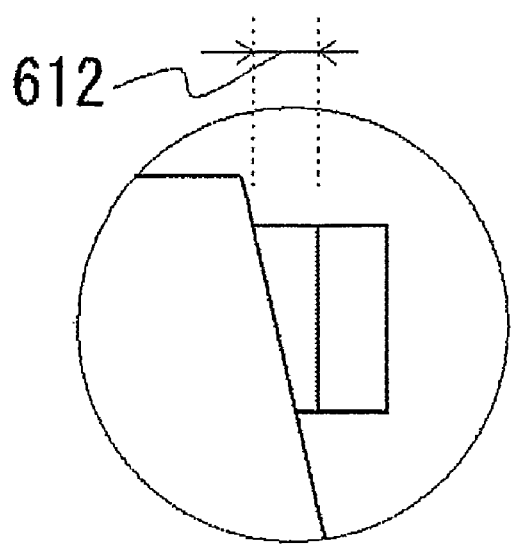
FIG. 6B is a partially enlarged view of a part of FIG. 6A.

As shown in FIG. 5B, the light emitting device of this example has a notch 411 formed at a corner along which the lead electrode 401 is bent. The notch avoid contacting between the package and an incurvate round portion (R portion) of the lead electrode 401 at which the lead electrode 401 is bent, thereby working the lead electrode 401 freely without shape defect of the package.

In addition, the light emitting device of this example has an additional draft 410 on an outer surface of the front side package, thereby forming extremely thin side walls of the opening easily.

INDUSTRIAL APPLICABILITY

The semiconductor device of the present invention may be utilized a light source for backlight of liquid crystal, a light source for various indicators, panel meters, indication lights, surface-emitting switches and optical sensors and the like.

What is claimed is:

1. A light emitting device comprising:
   a light emitting element; and
   a package comprising
      a front side package which is a part of the package located on a light-emitting side, and includes a front surface of the package,
      a rear side package which is a part of the package located on an opposite side of the light-emitting side, and comprises a back surface of the package,
      lead electrodes to be connected to the light emitting element, and
      an opening in front thereof for emitting a light emitted from the light emitting element,
   wherein a side surface of the package, located between said front surface and said back surface, comprises
      a first face adjacent to said back surface of the package, and along which a projecting end portion of one of the lead electrodes is located,
      a second face adjacent to the first face and having a plane direction different from the first face, and
      a third face adjacent to the second face and having a plane direction different from the second face, and
   wherein a part of one of the lead electrodes projects out from the package and bends along the rear side package and the first face.

2. The light emitting device according to claim 1, wherein the first face is nearly perpendicular to a principal surface of the lead electrode.

3. The light emitting device according to claim 1, wherein the second face is tilted so as to spread toward the front.

4. The light emitting device according to claim 2, wherein the second face is tilted so as to spread toward the front.

5. The light emitting device according to claim 1, wherein the third face is tilted so as to narrow toward the front.

6. The light emitting device a according to claim 2, wherein the third face is tilted so as to narrow toward the front.

7. The light emitting device a according to claim 3, wherein the third face is tilted so as to narrow toward the front.

8. The light emitting device according to claim 4, wherein the third face is tilted so as to narrow toward the front.

9. The light emitting device according to claim 1, wherein corners of the package along which the lead electrodes are bent are notched.

10. The light emitting device according to claim 2, wherein corners of the package along which the lead electrodes are bent are notched.

11. The light emitting device according to claim 3, wherein corners of the package along which the lead electrodes are bent are notched.

12. The light emitting device according to claim 4, wherein corners of the package along which the lead electrodes are bent are notched.

13. The light emitting device according to claim 5, wherein corners of the package along which the lead electrodes are bent are notched.

14. The light emitting device according to claim 6, wherein corners of the package along which the lead electrodes are bent are notched.

15. The light emitting device according to claim 7, wherein corners of the package along which the lead electrodes are bent are notched.

16. The light emitting device according to claim 8, wherein corners of the package along which the lead electrodes are bent are notched.

17. The light emitting device according to claim 1, wherein a second side surface of the package is located between said front surface and said back surface.

18. The light emitting device according to claim 17, wherein said second side surface comprises
- a first face adjacent to said back surface of the package, and along which another projecting end portion of a lead electrode is located, and
- a second face adjacent to the first face and having a plane direction different from the first face, and wherein said second faces of the side surfaces of the package are located on the rear side package.

19. The light emitting device according to claim 18, wherein said second side surface further comprises a third face adjacent to the second face of the second side surface and having a plane direction different from the second face, and wherein the third faces of the side surfaces of the package are located on the front side package.

20. The light emitting device according to claim 19, wherein the third faces of the side surfaces of the package are adjacent to the front surface of the package.

21. A light emitting device comprising:
a light emitting element; and
a package comprising
- a front side package which is a part of the package located on a light-emitting side, and includes a front surface of the package,
- a rear side package which is a part of the package located on an opposite side of the light-emitting side, and comprises a back surface of the package,
- lead electrodes to be connected to the light emitting element, and
- an opening in front thereof for emitting a light emitted from the light emitting element, wherein a side surface of the package, located between said front surface and said back surface, comprises
- a first face adjacent to said back surface of the package,
- a second face adjacent to the first face and having a plane direction different from the first face, and
- a third face adjacent to the second face and having a plane direction different from the second face, and wherein a part of one of the lead electrodes projects out from the package and bends along the front side package and the side surface of the package, such that a projecting end portion of the one lead electrode is located on the side surface of the package.

22. A light emitting device comprising:
a light emitting element; and
a package comprising
- a front side package which is a part of the package located on a light-emitting side, and includes a front surface of the package,
- a rear side package which is a part of the package located on an opposite side of the light-emitting side, and comprises a back surface of the package,
- lead electrodes to be connected to the light emitting element, and
- an opening in front thereof for emitting a light emitted from the light emitting element, wherein a side surface of the package, located between said front surface and said back surface of the package, comprises a first face, a second face and a third face, the second face having a plane direction different from the first face, and the third face having a plane direction different from the second face, and wherein, among said first, second and third faces:
- the first face is closest to said back surface of the package,
- the third face is closest to said front surface of the package,
- the second face is located between the first face and the third face, and wherein a part of one of the lead electrodes projects out from the package and bends along the rear side package and the first face, or along the front side package and the third face.

* * * * *